United States Patent [19]

Wu

[11] Patent Number: 5,721,168
[45] Date of Patent: Feb. 24, 1998

[54] METHOD FOR FORMING A RING-SHAPE CAPACITOR

[75] Inventor: Shye-Lin Wu, Hsinchu, Taiwan

[73] Assignee: Powerchip Semiconductor Corp., Taiwan

[21] Appl. No.: 757,102

[22] Filed: Dec. 2, 1996

[51] Int. Cl.⁶ .................................................. H01L 21/8242
[52] U.S. Cl. ....................................... 438/253; 438/240
[58] Field of Search ................................. 438/240, 253, 438/396, 675, 702

[56] References Cited

U.S. PATENT DOCUMENTS

| | | | |
|---|---|---|---|
| 5,061,650 | 10/1991 | Dennison et al. | 438/253 |
| 5,084,405 | 1/1992 | Fazan et al. | 438/240 |
| 5,429,979 | 7/1995 | Lee et al. | 438/253 |
| 5,498,562 | 3/1996 | Dennison et al. | 438/253 |

Primary Examiner—Chandra Chaudhuri
Attorney, Agent, or Firm—Hayes, Soloway, Hennessey, Grossman & Hage, P.C.

[57] ABSTRACT

A method for forming a ring-shape capacitor in a dynamic random access memory is disclosed. The present invention includes forming a first dielectric layer on a substrate. After a silicon nitride layer is formed on the first dielectric layer, a first doped polysilicon layer is formed on the silicon nitride layer, and a second dielectric layer is formed on the first doped polysilicon layer. After removing portions of the second dielectric layer, the first doped polysilicon layer, the silicon nitride layer and the first dielectric layer by a first photoresist layer, a contact hole is formed. A second doped polysilicon layer is formed over the second dielectric layer, and the contact hole is thus filled by the second doped polysilicon layer. Thereafter, portions of the second doped polysilicon layer and the second dielectric layer are removed using a second photoresist layer as a mask, thereby exposing the first doped polysilicon layer. A third dielectric layer is formed on the second doped polysilicon layer, the first polysilicon layer, and on the sidewalls of the second dielectric layer. After etching back the third dielectric layer, a third doped polysilicon layer is formed. Further etching back the third doped polysilicon to expose the silicon nitride layer and the third dielectric layer, the third dielectric layer, the second dielectric layer, and the silicon nitride layer are removed, thereby forming a ring-shape polysilicon.

18 Claims, 6 Drawing Sheets

METHOD FOR FORMING A RING-SHAPE CAPACITOR

BACKGROUND OF THE INVENTION

1. Field of the Invention

The present invention relates to a method for forming a capacitor in a dynamic random access memory, and particularly to a method for forming a ring-shape capacitor in a dynamic random access memory.

2. Description of the Prior Art

Recently, demand for semiconductor devices has rapidly increased owing to widespread use of information equipments such as computers. FIG. 1 shows a simplified diagram of the organization of large semiconductor memories. The storage cells of the memory 14 are arranged in an array including horizontal rows and vertical columns. The horizontal lines connected to all cells in the row are called word lines 11, and the vertical lines connected to all cells in the column are referred to as bit lines 13. Data flow into and out of the cells via those bit lines. Row address 10 and column address 12 are used respectively to access at random through selection of the appropriate word and bit line, thus achieving the purpose of reading or writing data in random order and at a fixed rate. A row address buffer 15 and a column address buffer 17 respectively receives row address 10 signals and column address 12 signals, which are then used for selecting a storage cell in the memory 14. Further, a row decoder 16 and a column decoder 18 are added to decode the row address 10 and the column address 12 into the word lines 11 and the bit lines 13 respectively, allowing fewer number of address lines been used for accessing a large number of storage cells in the memory 14. The array configuration of semiconductor memories lends itself well to the regular structure preferred in very large scale integration (VLSI) industry.

Dynamic random access memory (DRAM) becomes one of the most widely used types of semiconductor memory due to its low cost per bit, high device density and flexibility of use concerning reading and writing operations.

As the semiconductor memory device becomes highly integrated, the area occupied by a capacitor of a DRAM storage cell shrinks, thus decreasing the capacity of the capacitor owing to its smaller surface area of the capacitor. Therefore, it is required to reduce the cell dimension and yet obtain a high capacitance for achieving both high cell integration and large capacitance.

For increasing the capacitance while maintaining the high integration of the storage cells, the polysilicon layer has a multi-layer structure or spacers having a fin shape, a cylindrical shape or a rectangular frame extending through the multi-layer structure to increase the surface area of the capacitor electrode, thereby increasing its capacitance while maintaining the small area on the substrate surface. FIG. 2 shows the cross section of a traditional fin-structure capacitor. Consequently, this type capacitor have come to be widely used in accordance with higher integration of the semiconductor devices.

SUMMARY OF THE INVENTION

In accordance with the present invention, a method is provided for forming a ring-shape capacitor in a dynamic random access memory. The present invention includes forming a first dielectric layer on a substrate. After a silicon nitride layer is then formed on the first dielectric layer, a first doped polysilicon layer is formed on the silicon nitride layer, and a second dielectric layer is formed on the first doped polysilicon layer. Portions of the second dielectric layer, the first doped polysilicon layer, the silicon nitride layer and the first dielectric layer are removed using a first photoresist layer as a mask, thereby exposing the substrate to form a contact hole.

Thereafter, a second doped polysilicon layer is formed over the second dielectric layer, and the contact hole is filled by the second doped polysilicon layer. Portions of the second doped polysilicon layer and the second dielectric layer are removed using the second photoresist layer as a mask, thereby exposing the first doped polysilicon layer. A third dielectric layer is formed on the second doped polysilicon layer, the first polysilicon layer, and on the sidewalls of the second dielectric layer.

After etching back the third dielectric layer to expose the second doped polysilicon layer and the first doped polysilicon layer, a third doped polysilicon layer is formed over the second doped polysilicon layer, the third dielectric layer and the first doped polysilicon layer.

Further etching back the third doped polysilicon to expose the silicon nitride layer and the third dielectric layer, the third dielectric layer, the second dielectric layer, and the silicon nitride layer are then removed, thereby forming a ring-shape polysilicon comprising the remained first, the second and the third doped polysilicon layers. A fourth dielectric layer is formed on the surface of the ring-shape polysilicon and the first dielectric layer. A conductive layer is formed over the ring-shape polysilicon, thereby covering the ring-shape polysilicon to form a cell plate of the ring-shape capacitor.

DESCRIPTION OF THE PREFERRED EMBODIMENT

Figure 1:
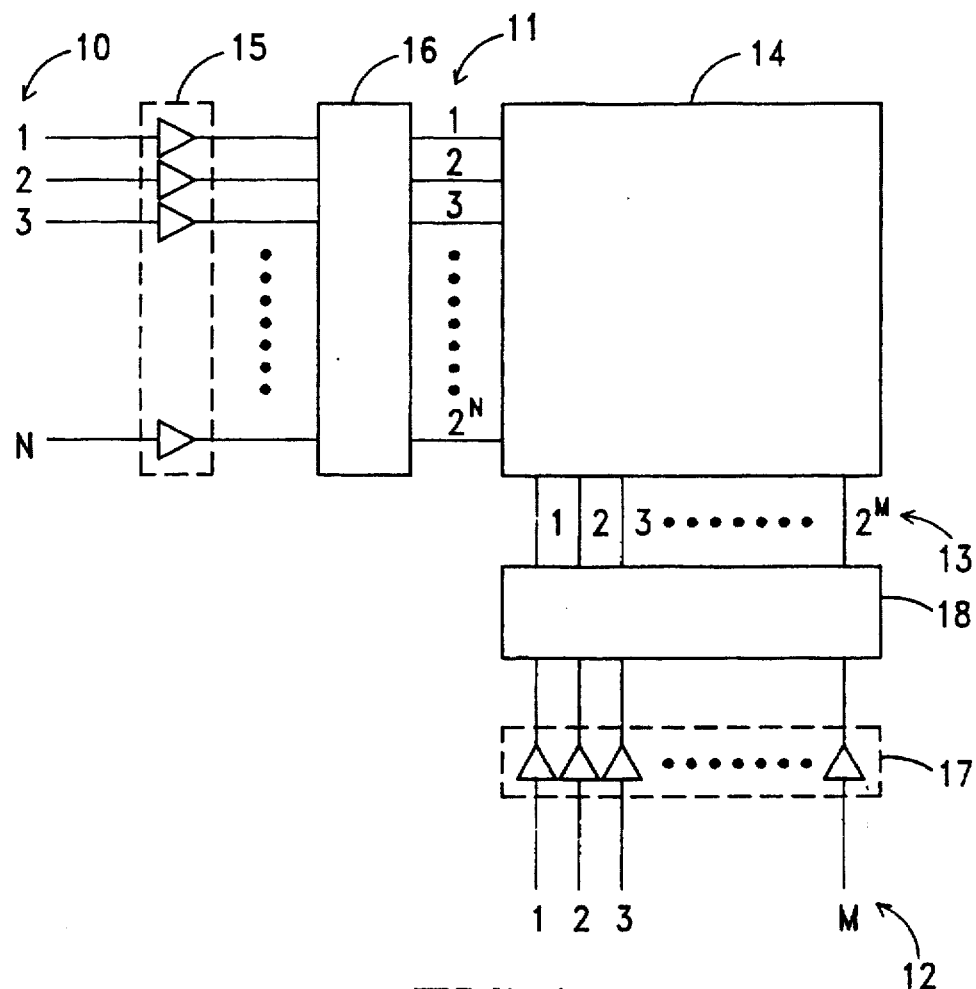
FIG. 1 shows a simplified diagram of the organization of large semiconductor memories.
Figure 2:
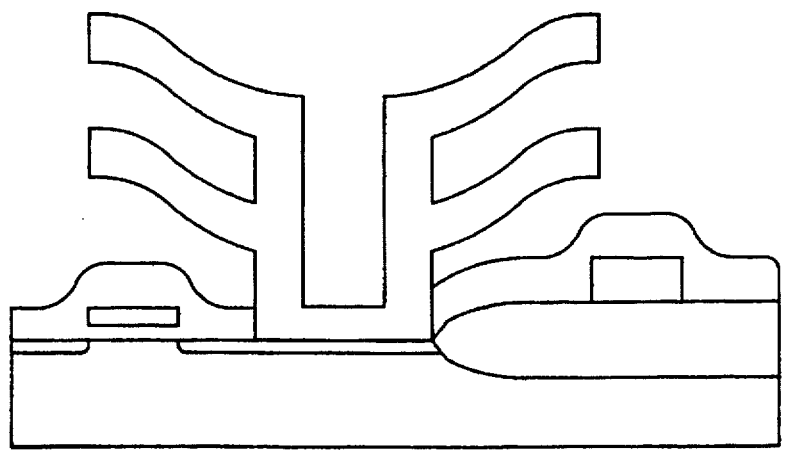
FIG. 2 shows the cross section of a traditional fin-structure capacitor.
Figure 3:
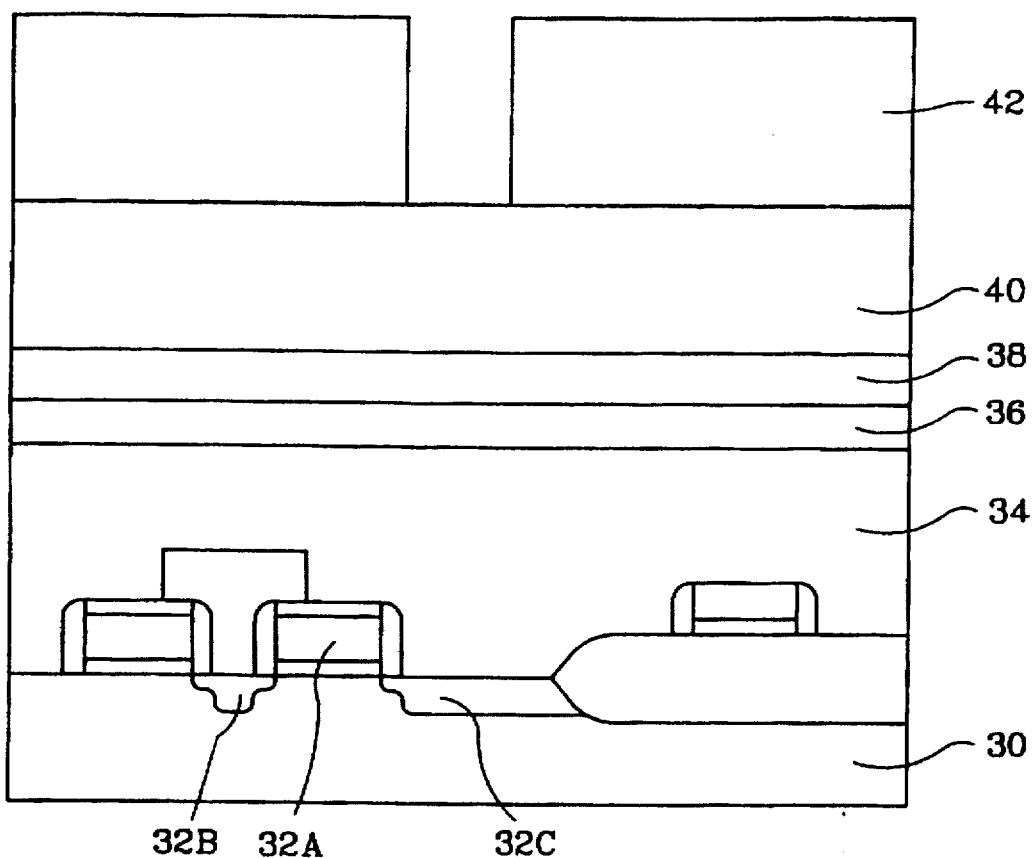
FIGS. 3 to 12 show cross-sectional views illustrative of various stages in the fabrication of a DRAM capacitor in accordance with one embodiment of the present invention.

Referring to FIG. 3, a cross-sectional view of a substrate 30 with a metal-oxide-semiconductor field effect transistor (MOSFET), this MOSFET having a gate 32A, a drain 32B and a source 32C, is conventionally formed in and on the substrate 30. A dielectric layer 34, such as a silicon dioxide layer having a thickness of about 3000~10000 angstroms is formed on the substrate 30. A tetraethoxysilane (TEOS) oxide is preferably used in this embodiment for its excellent uniformity and step coverage. The deposition is achieved by decomposing tetraethylorthosilicate $(Si(C_2H_5O)_4)$ with or without oxygen at low pressure and at a temperature between 650°~750° C. Other alternative to this dielectric layer 34 is Borosilicate glass (BSG), Phosphosilicate glass (PSG) or Borophosphosilicate glass (BPSG). A BSG layer is usually formed by oxidizing diborane and silane. A PSG is grown by oxidation of silane and phosphine. A silicon nitride layer 36 is then deposited to a thickness of about 300 to 2000 angstroms using conventional low pressure chemical vapor deposition (LPCVD) or plasma-enhanced chemical vapor deposition (PECVD) method. A polysilicon layer 38 having a thickness of about 300~2000 angstroms is deposited using any suitable low pressure chemical vapor deposition (LPCVD) process. In this embodiment, the LPCVD process forms the polysilicon layer 38 by the decomposition of silane at about 500°~650° C. at a pressure of about 0.1~1.0 torr, according to the reaction $SiH_4 \rightarrow Si+2H_2$ or $SiCl_2H_2 \rightarrow Si+2HCl$.

The polysilicon layer 38 is doped to reduce resistivity using any suitable technique. For example, the polysilicon layer 38 can be in-situ doped by adding arsine or phosphine to the silane gas mixture. Alternatively, doping can be performed using ion-implantation after deposition.

Another dielectric layer 40 having a thickness of about 500~10000 angstroms is formed on the polysilicon layer 38. A tetraethoxysilane (TEOS) is preferably used in this embodiment for its excellent uniformity and step coverage. Other alternative to this dielectric layer 40 is Borosilicate glass (BSG), Phosphosilicate glass (PSG) or Borophosphosilicate glass (BPSG). A photoresist layer 42, which defines a storage node area over a portion of the source electrode 32C of the MOS transistor, is formed using standard photoresist coating, exposure and development processes.

Figure 4:
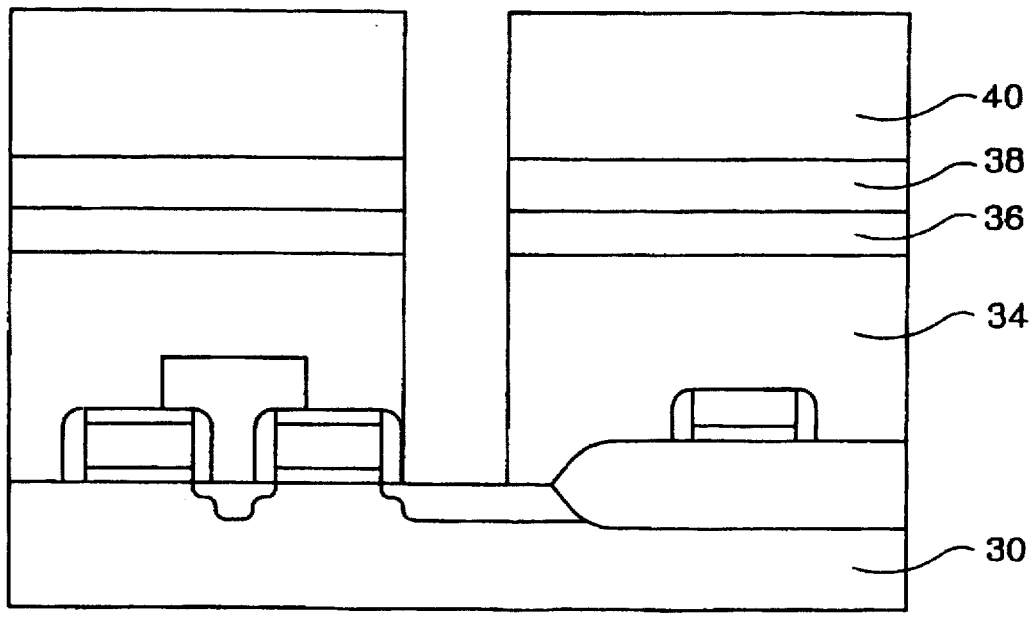

After removing portions of the dielectric layer 40, the polysilicon layer 38, the silicon nitride layer 36, and the dielectric layer 34 using the photoresist layer 42 as a mask, a contact hole is formed and the substrate 30 is exposed as shown in FIG. 4.

Figure 5:
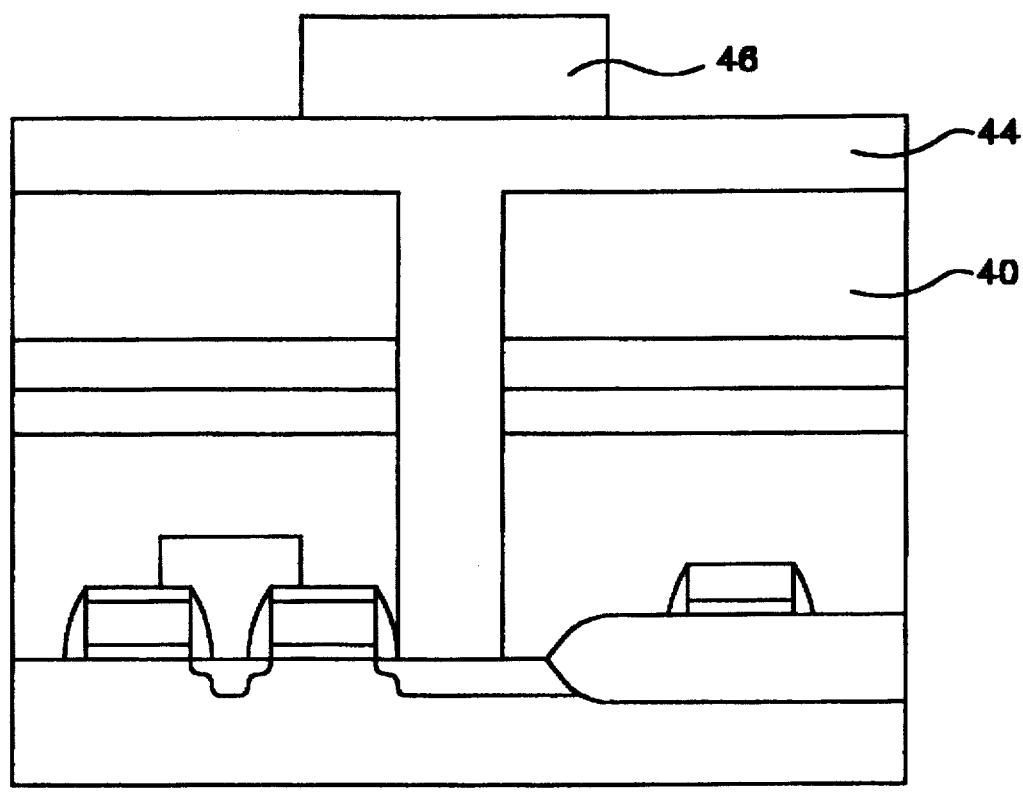

As shown in FIG. 5, a polysilicon layer 44 having a thickness of about 300~3000 angstroms is deposited over the dielectric layer 40 using any suitable low pressure chemical vapor deposition (LPCVD) process, therefore refilling the contact hole. In this embodiment, the LPCVD process forms the polysilicon layer 44 by the decomposition of silane at about 500°~650° C at a pressure of about 0.1~1.0 torr, according to the reaction $SiH_4 \rightarrow Si+2H_2$ or $SiCl_2H_2 \rightarrow Si+2HCl$.

Figure 6:
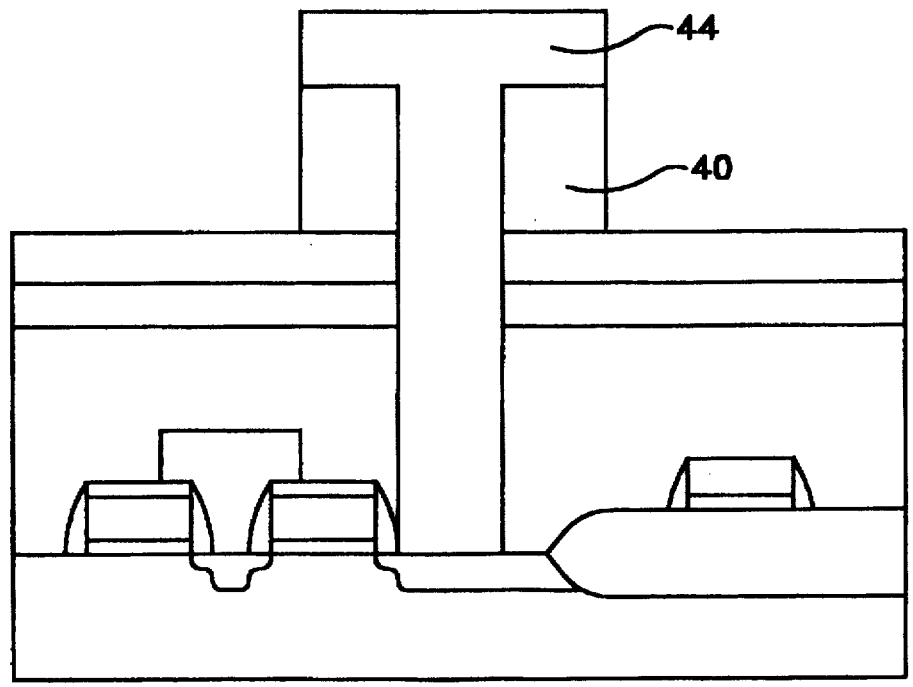

The polysilicon layer 44 is doped to reduce resistivity using any suitable technique. For example, the polysilicon layer 44 can be in-situ by adding arsine or phosphine to the silane gas mixture. Alternatively, doping can be performed using ion-implantation after deposition. A photoresist layer 46, which covers the storage node area over the portion of the source electrode 32C of the MOS transistor, is formed using standard photoresist coating, exposure and development processes. Portions of the doped polysilicon layer 44 and the dielectric layer 40 are removed using the photoresist layer 46 as a mask to form the structure of FIG. 6.

Figure 7:
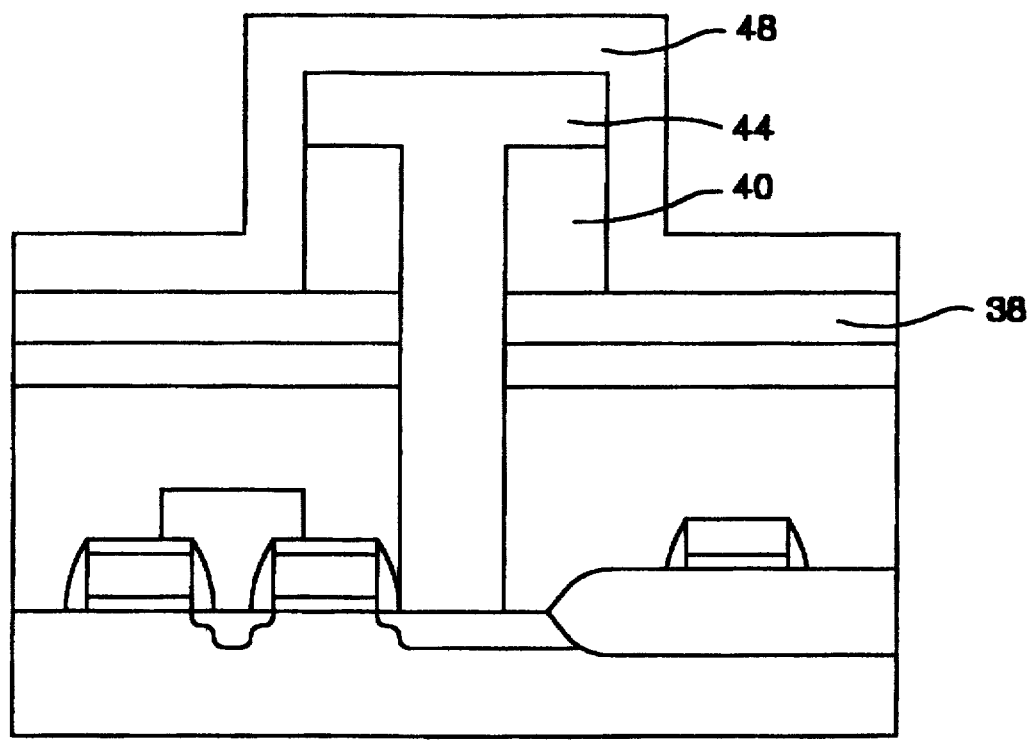

A dielectric layer 48, such as a silicon dioxide layer having a thickness of about 300~2000 angstroms is formed on the polysilicon layer 44, the polysilicon layer 38 and the sidewalls of the dielectric layer 40, resulting in the structure of FIG. 7. A tetraethoxysilane (TEOS) is preferably used in this embodiment for its excellent uniformity and step coverage. The deposition is achieved by decomposing tetraethylorthosilicate ($Si(C_2H_5O)_4$) with or without oxygen at low pressure and at a temperature between 650°~750° C.

Figure 8:
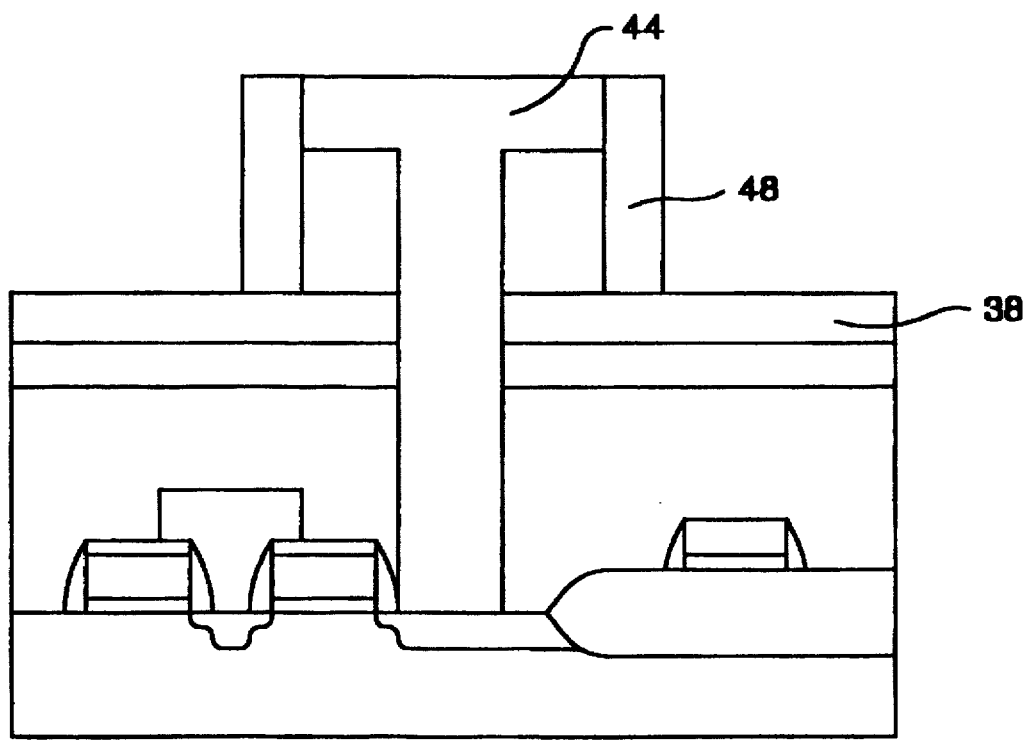
Figure 9:
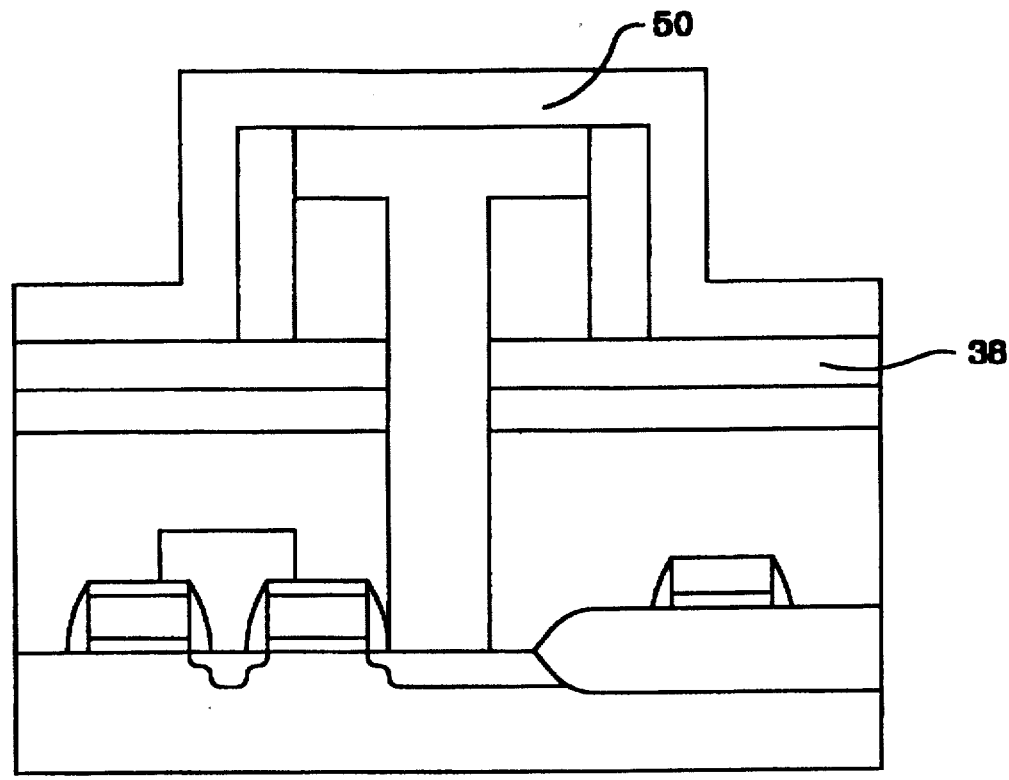

FIG. 8 shows the cross-sectional view of the structure after etching back the dielectric layer 48 to expose the doped polysilicon layer 44 and the polysilicon layer 50. Referring to FIG. 9, a polysilicon layer 50 having a thickness of about 300~3000 angstroms is deposited using any suitable low pressure chemical vapor deposition (LPCVD) process. In this embodiment, the LPCVD process forms the polysilicon layer 50 by the decomposition of silane at about 500°~650° C. at a pressure of about 0.1~1.0 torr, according to the reaction: $SiH_4 \rightarrow Si+2H_2$ or $SiCl_2H_2 \rightarrow Si+2HCl$.

The polysilicon layer 50 is doped to reduce resistivity using any suitable technique. For example, the polysilicon layer 50 can be in-sire doped by adding arsine or phosphine to the silane gas mixture. Alternatively, doping can be performed using ion-implantation after deposition.

Figure 10:
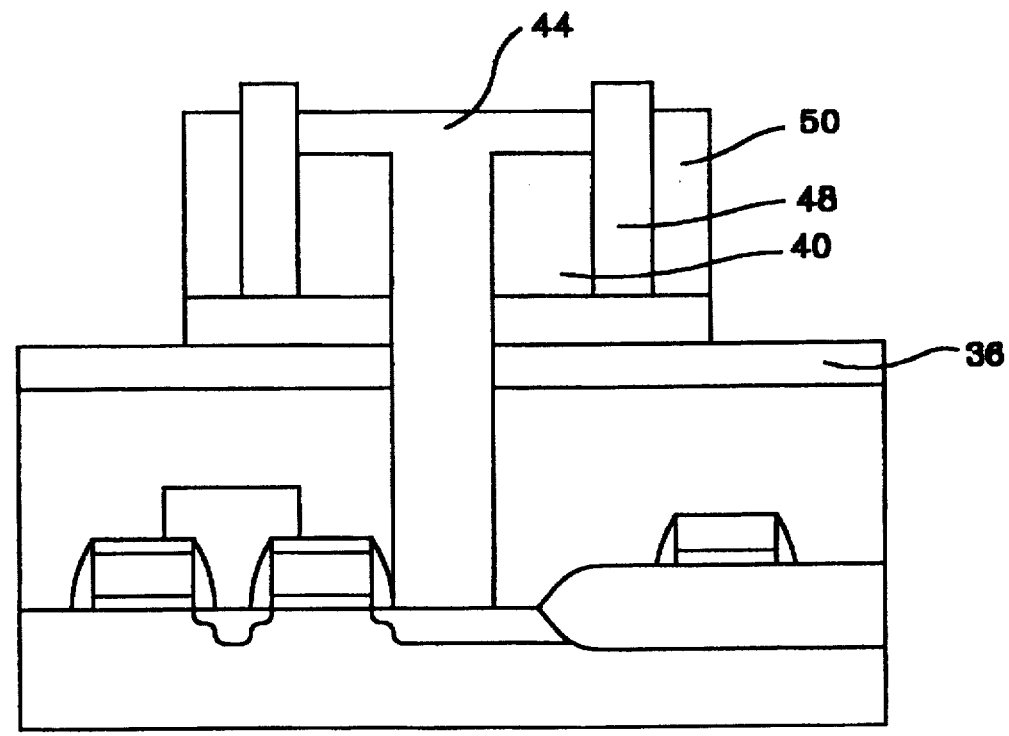
Figure 11:
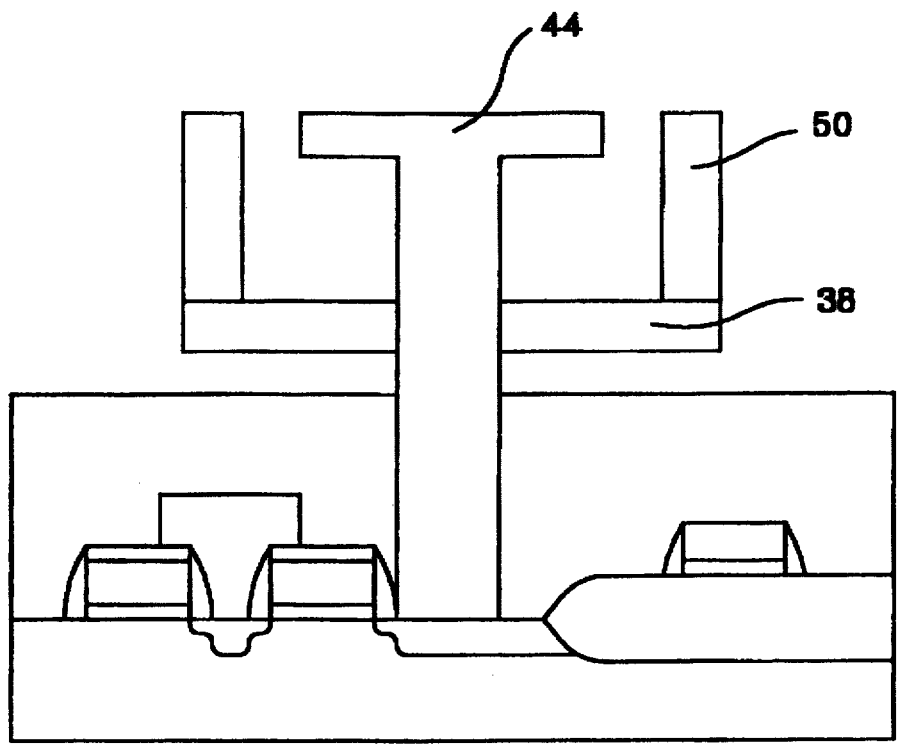

FIG. 10 shows the cross-sectional view of the structure after etching back the polysilicon layer 50 and/or the polysilicon layer 44 to expose the silicon nitride layer 36. The dielectric layer 48, the dielectric layer 40 and the silicon nitride layer 36 are removed, thereby forming a ring-shape polysilicon, shown in FIG. 11, which includes the remained polysilicon layer 44, the polysilicon layer 50 and the polysilicon layer 38. The removal of the dielectric layer 48, 40 is achieved using a wet etchant such as diluted hydrofluoric (HF) solution or a buffered oxide etch (BOE), while the removal of the silicon nitride layer 36 is done at 140°14 180° C. with a boiling phosphoric acid solution.

Figure 12:
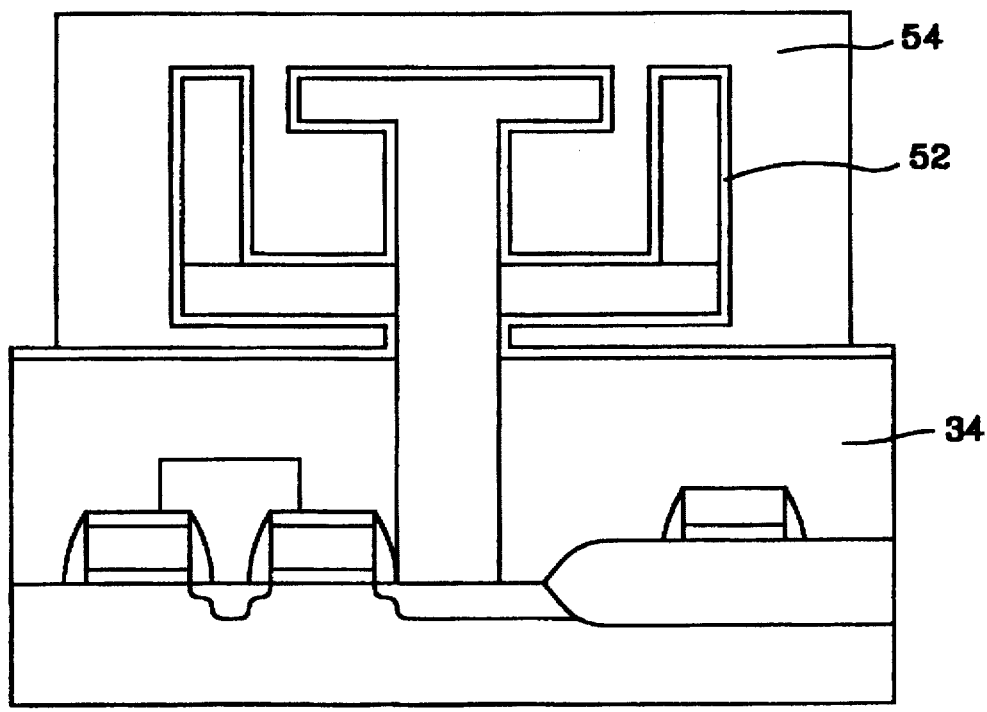

Referring to FIG. 12, a thin dielectric layer 52, such as stacked oxide-nitride-oxide (ONO) film, is formed on the surface of the ring-shape polysilicon and the dielectric layer 34. The ONO is reliable over shaped silicon surface such as the surface of the ring-shape polysilicon, and is typically used as a capacitor insulator. The bottom oxide layer is conventionally formed by thermally oxidizing the silicon surface, depositing an LPCVD silicon nitride layer and then oxidizing the silicon nitride layer to form the top oxide layer. Other material such as BST, lead zirconate titanate (PZT), $Ta_2O_5$ or other high dielectric material can be used instead of ONO layer. A conductive layer 54 is deposited over the structure shown in FIG. 12 as a cell plate of the capacitor formed in the dynamic random access memory.

Although specific embodiments have been illustrated and described, it will be obvious to those skilled in the art that various modification may be made without departing from the spirit which is intended to be limited solely by the appended claims.

What is claimed is:

1. A method for forming a ring-shape capacitor in a dynamic random access memory, said method comprising:

forming a first dielectric layer on a substrate having a structure formed therein and thereon;

forming a silicon nitride layer on the first dielectric layer;

forming a first doped polysilicon layer on the silicon nitride layer;

forming a second dielectric layer on the first doped polysilicon layer;

forming a first photoresist layer on the second dielectric layer, pattern of said first photoresist layer defining a storage node area over a portion of a source electrode of the structure;

removing portions of the second dielectric layer, the first doped polysilicon layer, the silicon nitride layer and the first dielectric layer using the first photoresist layer as a mask, thereby exposing the substrate to form a contact hole;

forming a second doped polysilicon layer over the second dielectric layer, said contact hole being filled by the second doped polysilicon layer;

forming a second photoresist layer on the second doped polysilicon layer, pattern of said second photoresist layer defining and covering the storage node area;

removing portions of the second doped polysilicon layer and the second dielectric layer using the second photoresist layer as a mask, thereby exposing the first doped polysilicon layer;

forming a third dielectric layer on the second doped polysilicon layer and the first polysilicon layer, and on the sidewalls of the second dielectric layer;

etching hack the third dielectric layer to expose the second doped polysilicon layer and the first doped polysilicon layer;

forming a third doped polysilicon layer over the second doped polysilicon layer, the third dielectric layer and the first doped polysilicon layer;

etching back the third doped polysilicon to expose the silicon nitride layer and the third dielectric layer;

removing the third dielectric layer, the second dielectric layer, and the silicon nitride layer, thereby forming a ring-shape polysilicon comprising the reminder first, the second and the third doped polysilicon layers;

forming a fourth dielectric layer on the surface of the ring-shape polysilicon and the first dielectric layer; and forming a conductive layer over the ring-shape polysilicon, thereby covering the ring-shape polysilicon to form a cell plate of the ring-shape capacitor.

2. The method according to claim 1, wherein said first dielectric layer is selected from the group consisting of tetraethoxysilane (TEOS), Borosilicate glass (BSG), Phosphosilicate glass (PSG) and Borophosphosilicate glass (BPSG).

3. The method according to claim 1, wherein said second dielectric layer is selected from the group consisting of tetraethoxysilane (TEOS), Borosilicate glass (BSG), Phosphosilicate glass (PSG) and Borophosphosilicate glass (BPSG).

4. The method according to claim 1, wherein said third dielectric layer is selected from the group consisting of tetraethoxysilane (TEOS), Borosilicate glass (BSG), Phosphosilicate glass (PSG) and Borophosphosilicate glass (BPSG).

5. The method according to claim 1, wherein said silicon nitride layer is formed by a low pressure chemical vapor deposition (LPCVD) method.

6. The method according to claim 1, wherein said silicon nitride layer is formed by a plasma-enhanced chemical vapor deposition (PECVD) method.

7. The method according to claim 1, wherein said first doped polysilicon layer is doped by an in-situ doping method.

8. The method according to claim 1, wherein said first doped polysilicon layer is doped by an ion-implant method.

9. The method according to claim 1, wherein said second doped polysilicon layer is doped by an in-situ doping method.

10. The method according to claim 1, wherein said second doped polysilicon layer is doped by an ion-implant method.

11. The method according to claim 1, wherein said third doped polysilicon layer is doped by an in-situ doping method.

12. The method according to claim 1, wherein said third doped polysilicon layer is doped by an ion-implant method.

13. The method according to claim 1, wherein said fourth dielectric layer is a member selected from the group consisting of a stacked oxide-nitride-oxide (ONO) layer, BST, lead zirconate titanate (PZT), $Ta_2O_5$ and high dielectric material.

14. A method for forming a ring-shape capacitor in a dynamic random access memory, said method comprising:

forming a first oxide layer on a substrate having a structure formed therein and thereon;

forming a silicon nitride layer on the first oxide layer;

forming a first doped polysilicon layer on the silicon nitride layer;

forming a second oxide layer on the first doped polysilicon layer;

forming a first photoresist layer on the second oxide layer, pattern of said first photoresist layer defining a storage node area over a portion of a source electrode of the structure;

removing portions of the second oxide layer, the first doped polysilicon layer, the silicon nitride layer and the first oxide layer using the first photoresist layer as a mask, thereby exposing the substrate to form a contact hole;

forming a second doped polysilicon layer over the second oxide layer, said contact hole being filled by the second doped polysilicon layer;

forming a second photoresist layer on the second doped polysilicon layer, pattern of said second photoresist layer defining and covering the storage node area;

removing portions of the second doped polysilicon layer and the second oxide layer using the second photoresist layer as a mask, thereby exposing the first doped polysilicon layer;

forming a third oxide layer on the second doped polysilicon layer and the first polysilicon layer, and on the sidewalls of the second oxide layer;

etching back the third oxide layer to expose the second doped polysilicon layer and the first doped polysilicon layer;

forming a third doped polysilicon layer over the second doped polysilicon layer, the third oxide layer and the first doped polysilicon layer;

etching hack the third doped polysilicon to expose the silicon nitride layer and the third oxide layer;

removing the third oxide layer, the second oxide layer, and the silicon nitride layer, thereby forming a ring-shape polysilicon comprising the remained first, the second and the third doped polysilicon layers;

forming a fourth oxide layer on the surface of the ring-shape polysilicon and the first oxide layer; and forming a conductive layer over the ring-shape polysilicon, thereby covering the ring-shape polysilicon to form a cell plate of the ring-shape capacitor.

15. The method according to claim 14, wherein said first oxide layer is selected from the group consisting of tetraethoxysilane (TEOS), Borosilicate glass (BSG), Phosphosilicate glass (PSG) and Borophosphosilicate glass (BPSG).

16. The method according to claim 14, wherein said second oxide layer is selected from the group consisting of tetraethoxysilane (TEOS), Borosilicate glass (BSG), Phosphosilicate glass (PSG) and Borophosphosilicate glass (BPSG).

17. The method according to claim 14, wherein said third oxide layer is selected from the group consisting of tetraethoxysilane (TEEOS), Borosilicate glass (BSG), Phosphosilicate glass (PSG) and Borophosphosilicate glass (BPSG).

18. A method for forming a ring-shape capacitor in a dynamic random access memory, said method comprising:

forming a first tetraethoxysilane (TIEOS) layer on a substrate having a structure formed therein and thereon;

forming a silicon nitride layer on the first TEOS layer;

forming a first doped polysilicon layer on the silicon nitride layer;

forming a second TEOS layer on the first doped polysilicon layer;

forming a first photoresist layer on the second TEOS layer, pattern of said first photoresist layer defining a storage node area over a portion of a source electrode of the structure;

removing portions of the second TEOS layer, the first doped polysilicon layer, the silicon nitride layer and the first TEOS layer using the first photoresist layer as a mask, thereby exposing the substrate to form a contact hole;

forming a second doped polysilicon layer over the second TEOS layer, said contact hole being filled by the second doped polysilicon layer;

forming a second photoresist layer on the second doped polysilicon layer, pattern of said second photoresist layer defining and covering the storage node area;

removing portions of the second doped polysilicon layer and the second TEOS layer using the second photoresist layer as a mask, thereby exposing the first doped polysilicon layer;

forming a third TEOS layer on the second doped polysilicon layer and the first polysilicon layer, and on the sidewalls of the second TEOS layer;

etching back the third TEOS layer to expose the second doped polysilicon layer and the first doped polysilicon layer;

forming a third doped polysilicon layer over the second doped polysilicon layer, the third TEOS layer and the first doped polysilicon layer;

etching back the third doped polysilicon to expose the silicon nitride layer and the third TEOS layer;

removing the third TEOS layer, the second TEOS layer, and the silicon nitride layer, thereby forming a ring-shape polysilicon comprising the remained first, the second and the third doped polysilicon layers;

forming a fourth TEOS layer on the surface of the ring-shape polysilicon and the first TEOS layer; and forming a conductive layer over the ring-shape polysilicon, thereby covering the ring-shape polysilicon to form a cell plate of the ring-shape capacitor.

* * * * *

UNITED STATES PATENT AND TRADEMARK OFFICE
CERTIFICATE OF CORRECTION

PATENT NO. : 5,721,168
DATED : February 24, 1998
INVENTOR(S) : Shye-Lin Wu

It is certified that error appears in the above-identified patent and that said Letters Patent is hereby corrected as shown below:

Claim 1, Col. 5, line 1, "hack" should be --back--.

Claim 1, Col. 5, line 11, "reminder" should be --remained--

Claim 14, Col. 6, line 30, "hack" should be --back--.

Claim 18, Col. 6, line 56, "(TIEOS)" should be --(TEOS)--.

Claim 18, Col. 8, line 1, "hack" should be --back--.

Claim 18, Col. 8, line 5, "(TIEOS)" should be --TEOS--

Claim 18, Col. 8, line 8, "(TIEOS)" should be --TEOS--

Signed and Sealed this

Third Day of November, 1998

Attest:

*Attesting Officer*

BRUCE LEHMAN
*Commissioner of Patents and Trademarks*